(12) United States Patent
Jeol

(10) Patent No.: US 9,012,544 B2
(45) Date of Patent: Apr. 21, 2015

(54) POLYAMIDE COMPOSITION FOR SURFACE-MOUNTED COMPONENTS

(75) Inventor: Stéphane Jeol, Lyons (FR)

(73) Assignee: Rhodia Operations, Paris (FR)

( * ) Notice: Subject to any disclaimer, the term of this patent is extended or adjusted under 35 U.S.C. 154(b) by 0 days.

(21) Appl. No.: 13/806,702

(22) PCT Filed: Jun. 21, 2011

(86) PCT No.: PCT/EP2011/060293
§ 371 (c)(1),
(2), (4) Date: Mar. 7, 2013

(87) PCT Pub. No.: WO2011/161082
PCT Pub. Date: Dec. 29, 2011

(65) Prior Publication Data
US 2013/0153643 A1 Jun. 20, 2013

(30) Foreign Application Priority Data
Jun. 22, 2010 (FR) .................................... 10 54929

(51) Int. Cl.
| | | |
|---|---|---|
| *C08K 5/34* | (2006.01) | |
| *C08K 5/3492* | (2006.01) | |
| *C08K 5/3445* | (2006.01) | |
| *C08K 5/3477* | (2006.01) | |
| *C08K 5/49* | (2006.01) | |
| *C08K 5/51* | (2006.01) | |
| *C08K 5/52* | (2006.01) | |
| *C08K 5/55* | (2006.01) | |
| *C08K 5/09* | (2006.01) | |
| *C08K 5/12* | (2006.01) | |
| *C08K 5/16* | (2006.01) | |
| *C08K 3/30* | (2006.01) | |
| *C08L 77/00* | (2006.01) | |
| *C08L 77/06* | (2006.01) | |
| *C09K 21/04* | (2006.01) | |
| *C09K 21/08* | (2006.01) | |
| *C09K 21/10* | (2006.01) | |
| *C09K 21/12* | (2006.01) | |
| *C08K 5/5313* | (2006.01) | |
| *C08K 7/14* | (2006.01) | |
| *H05K 3/34* | (2006.01) | |

(52) U.S. Cl.
CPC . *C08L 77/00* (2013.01); *C08K 5/49* (2013.01); *C08L 77/06* (2013.01); *C09K 21/04* (2013.01); *C09K 21/08* (2013.01); *C09K 21/10* (2013.01); *C09K 21/12* (2013.01); *C08K 5/5313* (2013.01); *C08K 7/14* (2013.01); *C08L 2205/02* (2013.01); *H05K 3/341* (2013.01)

(58) Field of Classification Search
USPC ........... 524/92, 100, 106, 101, 117, 139, 145, 524/183, 186, 296, 414, 417, 423
See application file for complete search history.

(56) References Cited

U.S. PATENT DOCUMENTS

| | | | |
|---|---|---|---|
| 6,140,459 A * | 10/2000 | Leboeuf et al. ................ | 528/310 |
| 6,211,402 B1 | 4/2001 | Kleiner | |
| 6,255,371 B1 | 7/2001 | Schlosser et al. | |
| 6,344,158 B1 | 2/2002 | Schlosser et al. | |
| 6,365,071 B1 | 4/2002 | Jenewein et al. | |
| 6,525,166 B1 | 2/2003 | De Silvestro et al. | |
| 8,334,359 B2 * | 12/2012 | Touraud et al. ................ | 528/196 |
| 8,680,199 B2 * | 3/2014 | Touraud et al. ................ | 524/607 |
| 2006/0189747 A1 * | 8/2006 | Joachimi et al. ............... | 524/514 |
| 2006/0264542 A1 | 11/2006 | Schneider | |
| 2011/0251341 A1 | 10/2011 | Touraud et al. | |

FOREIGN PATENT DOCUMENTS

| | | |
|---|---|---|
| EP | 0 682 057 A1 | 11/1995 |
| EP | 0 832 149 B1 | 7/2000 |
| EP | 1 613 698 B1 | 6/2008 |
| FR | 2 743 077 A1 | 7/1997 |
| WO | 2009/012936 A1 | 1/2009 |
| WO | 2010/034805 A1 | 1/2009 |
| WO | 2010/034803 A2 | 4/2010 |

OTHER PUBLICATIONS

International Search Report issued on Sep. 6, 2011, by the European Patent Office as the International Searching Authority in International Patent Application No. PCT/EP2011/060293.

* cited by examiner

*Primary Examiner* — Kriellion Sanders

(57) ABSTRACT

A polyamide composition for surface-mounted components is described. Also described are compositions for surface-mounted components (SMCs) including a semiaromatic polyamide modified by a hydroxyaromatic compound, reinforcing fillers, and a flame retardant. Further, the compositions have many advantages linked to the uses thereof in lead-free reflow soldering processes, in particular a good dimensional stability and a blistering resistance during the use of articles produced from these compositions.

15 Claims, No Drawings

POLYAMIDE COMPOSITION FOR SURFACE-MOUNTED COMPONENTS

CROSS-REFERENCE TO PRIOR APPLICATIONS

This application is a National Stage of PCT/EP2011/060293, filed Jun. 21, 2011, and designating the United States (published in French on Dec. 29, 2011, as WO 2011/161082 A1; the title and abstract were published in English), which claims priority to FR 10/54929, filed Jun. 22, 2010, each hereby expressly incorporated by reference in its entirety and each assigned to the assignee hereof.

The present invention relates to compositions for surface-mounted components (SMCs) comprising at least: A) a semi-aromatic polyamide modified by a hydroxyaromatic compound; B) reinforcing fillers; and C) a flame retardant. These compositions have many advantages associated with their use in lead-free reflow soldering processes, in particular a good dimensional stability and a blistering resistance during the use of articles produced from these compositions.

PRIOR ART

Surface-mounted components (SMCs) are electronic components intended to be connected to printed circuit boards by a technique known as surface-mount technology (SMT).

This technique involves soldering the components of a board to its surface by assembling them using a binder or solder, itself consisting of a metal other than the parts to be assembled. A process known as reflow soldering is generally used, in which a solder paste or cream is used initially to attach the electrical components to their support. The assembly obtained is then subjected to high temperatures: the heat melts the constituents of the solder paste, permanently connecting the electronic components to their support. This is one of the most commonly used methods for connecting electronic components to printed circuit boards.

For high-quality soldering it is necessary to identify the optimum temperature profile for melting the solder paste and to be able to reproduce it over time. Each solder joint on a circuit board must be heated in the same way, in order to obtain the desired soldering quality. The type of heat source is not important, but the heat has to be applied to the solder joint in a controlled manner. The upward and downward temperature gradients must be compatible with the solder paste and with the plastic components.

A solder paste is a suspension of metal powder in a viscous liquid known as flux. The metal alloy elements from which the paste is formed have the characterizing feature that they melt at a temperature below the melting point of the components to be soldered. The metal alloy balls are spherical in shape, which helps to reduce surface oxidation and to form good-quality joints with adjacent particles. Solder pastes are classified by particle size in accordance with the standard JEDEC J-STD 005. Since the coming into force of European Directive 2002/95/EC (RoHS), which has led to a ban on lead, hexavalent chromium, mercury, cadmium, PBB and PBDE, the major change that is underway within the electronics industry is the switch to lead-free soldering (LFS). That is because, until recently, solders were produced using tin-lead (SnPb) type alloys. The advantage of lead was in particular that it lowered the reflow temperature of tin alloys. Numerous substitute alloys are now used in solder pastes. Tin-silver-copper (SnAgCu), tin-silver (SnAg) and tin-copper (SnCu) alloys are the main alloys used. Their melting point is substantially higher, by some tens of degrees, compared to that of tin-lead alloys, which means working at temperatures in the region of 240-260° C. Even so, alloys with a lower melting point are being sought. Indeed, for lead-free alloys, the NEMI (National Electronics Manufacturing Initiative) recommends a minimum reflow temperature of 15° C. above the melting point of the alloy. This minimum temperature is necessary in order to achieve an adequate distribution of the alloy and to produce intermetallic compounds in the solder joint. Such compounds give the assembly its mechanical strength. The time for which the solder joint is above the melting point is referred to as the wetting time. For most lead-free pastes the wetting time is from 60 to 90 seconds.

This temperature increase has several negative consequences, in particular on the heat resistance of the components, which have to be able to withstand higher temperatures and higher thermal shocks. Similarly, there is now a requirement to manage moisture sensitivity levels (MSLs) more strictly than before. That is because an uptake of moisture by the components prior to the reflow step can cause them to be destroyed, especially if their dimensional stability is inadequate. Vacuum packing, storage in dry cabinets and regulation of workshop humidity levels are all new constraints that companies have to take incorporate. Moreover, during the reflow soldering process the polymers used in the components are exposed to temperatures that may cause blistering phenomena or blistering defects.

The use of SMCs based on high-temperature-resistant polyamide polymer, in particular aromatic or semiaromatic polyamides, is known from the prior art. Mention may be made in this respect to formulations based on polyamides 66/6T, polyamides 46, polyamides 6/6T, polyamides 6T/4T/46 as mentioned in the application WO2009/012936, and polyamides 9T, in the presence or absence of flame retardants. The patent EP 1 613 698 describes in this respect a composition comprising a partially aromatic polyamide and a flame retardant based on phosphinic or diphosphinic acid salt.

However, these formulations exhibit significant water uptake levels, which can lead to an inadequate dimensional stability in a damp environment, requiring strict management of moisture levels before and during lead-free reflow soldering processes.

There was therefore a need to develop a polyamide composition allowing good properties to be obtained and the properties to be retained during lead-free reflow soldering processes, in particular mechanical, dimensional stability, fireproofing and blistering resistance properties.

INVENTION

The applicant has now disclosed a formulation for SMCs that combines excellent mechanical, dimensional stability, fireproofing and blistering resistance properties.

The present invention firstly provides a component intended for surface mounting (SMC), in particular a surface-mounted component, obtained at least from a composition comprising at least A) a semiaromatic polyamide modified by a aromatic hydroxyl compound; B) reinforcing fillers; and C) a flame retardant.

The invention relates more particularly to electronic components intended for surface mounting.

Surprisingly it has been found that the combined use of a polyamide modified by a aromatic hydroxyl compound and reinforcing fillers in a polyamide composition results in a remarkable dimensional stability even if the polyamide modified by a hydroxyaromatic compound did not itself have a good dimensional stability. The compositions according to the invention exhibit excellent dimensional stability after demolding of the articles, before and after the soldering process, and after exposure to heat and moisture. When used in soldering or brazing processes, the components exhibit no blistering phenomena or blistering defects.

The term "blistering" corresponds to two distinct phenomena: blistering at the interfaces of electrically conductive and insulating elements or blistering within the electrically insulating material, in this case the polymer composition. It is primarily the first phenomenon that is addressed in the literature, whereas blistering within the electrically insulating material has not as yet been studied in depth.

It has now been discovered that the origin of the blistering visible within a polymer can be linked to the absorption of water, which is dependent on the free volume available between the chains of the macromolecular network, the polarity of the polymer groups and molecular movements. It appears that in the case of fine parts of 0.4 mm to 1.6 mm in thickness the rapid rise in temperature during the reflow process does not allow sufficient time for all of the evaporated water to diffuse to the outside of the polymer. This gives rise to a considerable pressure against the edges of the solid, resulting in a blister. To reduce the risk of blistering it therefore appeared important to limit the presence of water within the polymer, in particular by reducing its water uptake. As far as the polyamide is concerned, the use of an additive that is conventionally used to this end, such as novolac resin, does not control blistering at all and on the contrary appears even to intensify the blistering phenomenon. Such an effect has not been able to be achieved solely by combining the aforementioned means.

Within the meaning of the invention a semiaromatic polyamide modified by a aromatic hydroxyl compound is understood to be a polyamide obtained by using aliphatic monomers and aromatic monomers together with a aromatic hydroxyl compound.

A semiaromatic polyamide in which 5 to 50 mol % of the monomers used contain aromatic groups, including the aromatic hydroxyl compounds, is preferably used.

The monomers of the semiaromatic polyamide may in particular be diacid monomers, in particular aliphatic, cycloaliphatic, arylaliphatic or aromatic diacid monomers, diamine monomers, in particular aliphatic diamine monomers, and/or amino acids or lactams. These are generally the monomers conventionally used to produce semicrystalline polyamides, such as aliphatic polyamides, semiaromatic polyamides and more generally linear polyamides obtained by polycondensation between a saturated aliphatic or aromatic diacid and a saturated aromatic or aliphatic primary diamine, polyamides obtained by condensation of a lactam or of an amino acid, or linear polyamides obtained by condensation of a blend of these various monomers. The polyamide monomers may optionally contain unsaturated groups or heteroatoms such as oxygen, sulfur, or nitrogen.

The dicarboxylic acids can be selected from glutaric acid, adipic acid, pimelic acid, suberic acid, azelaic acid, sebacic acid, dodecanedioic acid, brassylic acid; 1,2- or 1,3-cyclohexanedicarboxylic acid; 1,2- or 1,3-phenylenediacetic acid; 1,2- or 1,3-cyclohexanediacetic acid; isophthalic acid; terephthalic acid; 4,4-benzophenone dicarboxylic acid; 2,5-naphthalenedicarboxylic acid; and p-tert-butylisophthalic acid. Adipic, terephthalic and isophthalic acids are the preferred dicarboxylic acids.

The diamines can be selected from for example hexamethylenediamine; 1,4-diaminobutane; 1,5-diaminopentane; 2-methylpentamethylenediamine; 2-methylhexamethylenediamine; 3-methylhexamethylenediamine; 2,5-dimethylhexamethylenediamine; 2,2-dimethylpentamethylenediamine; nonanediamine; 1,10-diaminodecane; 5-methylnonanediamine; dodecamethylenediamine; 2,2,4- and 2,4,4-trimethylhexamethylenediamine; 2,2,7,7-tetramethyloctamethylenediamine; isophorone diamine; diaminodicyclohexylmethane, and C2-C16 aliphatic diamines which can be substituted with one or more alkyl groups. Hexamethylenediamine and 1,4-diaminobutane are the preferred diamines.

The modified polyamide of the invention can be obtained in particular from a lactam monomer or an amino acid, preferably an aliphatic amino acid. Lactams or amino acids that may be mentioned by way of example are caprolactam, 6-aminohexanoic acid, 5-aminopentanoic acid, 7-aminoheptanoic acid, 11-aminoundecanoic acid, dodecanolactam.

These polyamides can be modified in particular by difunctional or monofunctional monomers, such as in particular diacids or diamines, monoacids or monoamines.

Polyamides according to the invention can also be obtained by blending, in particular by melt blending, polyamides with chain-length-modifying monomers, such as in particular diamines, carboxylic diacids, monoamines and/or carboxylic monoacids.

The composition of the invention can likewise comprise copolyamides derived in particular from the above polyamides, or blends of these polyamides or (co)polyamides.

A star polyamide comprising star macromolecular chains and if necessary linear macromolecular chains can likewise be used as a high-fluidity polyamide.

The polyamide having a star structure is a polymer comprising star macromolecular chains and optionally linear macromolecular chains. Polymers comprising such star macromolecular chains are described for example in the documents FR 2 743 077, FR 2 779 730, EP 0 682 057 and EP 0 832 149. These compounds are known to have an improved fluidity as compared with linear polyamides. Star macromolecular chains comprise a core and at least three polyamide branches. The branches are connected to the core by a covalent bond via an amide group or a different type of group. The core is an organic or organometallic chemical compound, preferably a hydrocarbon compound, optionally comprising heteroatoms, to which the branches are connected. The branches are polyamide chains. The polyamide chains forming the branches are preferably of the type obtained by polymerization of lactams or amino acids, for example of the polyamide 6 type. The polyamide having a star structure according to the invention optionally comprises, in addition to the star chains, linear polyamide chains. In this case the weight ratio of the quantity of star chains to the sum of the quantities of star chains and linear chains is between 0.5 and 1, limits included. It is preferably between 0.6 and 0.9.

The (co)polyamides selected from the group consisting of polyamide 6T, polyamide 66/6T, polyamide 6I, polyamide 66/6I, polyamide 6T/6I, copolyamide 6/6T of differing molar compositions and blends thereof can be used in particular.

The polyamides of the invention generally have a melting point between 150° C. and 340° C. and more particularly between 240° C. and 340° C. for processes using the current lead-free soldering alloys.

The composition according to the invention preferably contains from 30% to 75% by weight of polyamide, with respect to the total weight of the composition, preferably from 35% to 60% by weight.

The aromatic hydroxyl compound or hydroxyaromatic compound is a compound bearing at least one, in particular one or two, functions that are capable of reacting with the amine or acid functions of the polyamide or the polyamide monomers. The hydroxyl group of the compound is advantageously not hindered, which means for example that the carbon atoms in a position of the hydroxyl function are preferably not substituted with bulky substituents such as branched alkyls.

An "aromatic hydroxyl group" is understood to be a hydroxyl function bound to a carbon atom that is part of an aromatic ring.

A "hydroxyaromatic compound" is understood to be an organic compound comprising at least one aromatic hydroxyl group.

The functions of the hydroxyaromatic compound that are capable of reacting with the polyamide functions are in particular the acid, ketone, amine and aldehyde functions.

An "acid function" is understood to be a carboxylic acid function or a function derived from a carboxylic acid function, such as acid chloride, acid anhydride, amide or ester.

Carboxylic acid is understood to refer to carboxylic acids and derivatives thereof, such as acid anhydrides, acid chlorides, amides or esters.

The aromatic hydroxyl groups of the invention are not regarded as functions that react with acid functions.

The present invention relates in particular to a polyamide modified by a compound containing at least one aromatic hydroxyl group that is chemically bonded to the polymer chain, this polyamide being obtainable by polymerization of, in addition to the polyamide monomers, a hydroxyaromatic compound, or by melt blending a partially or completely formed polyamide with a hydroxyaromatic compound, in particular during a reactive extrusion process. The modified polyamide according to the invention can likewise be obtained by polycondensation in solid phase or in solvent phase in the case of certain polyamides.

"Chemically bonded" is understood to mean bonded by a covalent bond. Once it is chemically bonded to the polyamide chain, the hydroxyaromatic compound becomes a hydroxyaromatic unit and the modified polyamide of the invention is a polyamide containing hydroxyaromatic units.

The hydroxyaromatic compound can be represented for example by the following formula (I):

$$(HO)_x-Z-(F)_n \quad (I)$$

in which:
Z is a multivalent, at least divalent, aromatic or arylaliphatic hydrocarbon radical,
x is between 1 and 10;
F is an acid, aldehyde, amine or ketone function that is capable of bonding to an acid or amine function of the polyamide monomers, and
n is between 1 and 5.

Z can optionally comprise heteroatoms, such as N and O. Z for example can be selected from the group consisting of: benzene, methylbenzene, naphthalene, biphenyl, diphenyl ether, diphenyl sulfide, diphenyl sulfone, ditolyl ether, xylylene, diethylbenzene or pyridine.

An "arylaliphatic radical" is understood to be a radical according to which at least one function F of the compound of formula (I) is not bonded to this radical by a carbon atom that is part of an aromatic ring.

Z advantageously comprises between 6 and 18 carbon atoms.

It is perfectly possible for a hydroxyaromatic compound to contain several types of functions F of different kinds.

This compound is preferably selected from the group consisting of: 2-hydroxyterephthalic acid, 5-hydroxyisophthalic acid, 4-hydroxyisophthalic acid, 2,5-dihydroxyterephthalic acid, 4-hydroxyphenylacetic acid or gallic acid, L-tyrosine, 4-hydroxyphenylacetic acid, 3,5-diaminophenol, 5-hydroxy-m-xylylene-diamine, 3-aminophenol, 3-amino-4-methylphenol, and 3-hydroxy-5-aminobenzoic acid.

Within the context of the invention, blends of different compounds of formula (I) can be used.

The molar proportion of hydroxyaromatic compound with respect to the total quantity of monomers constituting the polyamide, for example the sum of diacid, diamine amino acid and monomers and the hydroxyaromatic compound, is generally between 0.1% and 100%, preferably between 1% and 70%, more preferably between 0.5% and 60%, more preferably still between 2.5% and 50%.

The polyamide of the invention is obtained in particular by a melt polymerization process of the various monomers described above, these monomers being present in whole or in part.

The expression "melt polymerization" is understood to mean that the polymerization is performed in the liquid state, and that the polymerization medium contains no solvent other than water, optionally. The polymerization medium can for example be an aqueous solution comprising the monomers, or a liquid comprising the monomers. The polymerization medium advantageously comprises water as the solvent. This facilitates stirring of the medium and hence its homogeneity. The polymerization medium can likewise contain additives such as chain limiters. The modified polyamide of the invention is generally obtained by polycondensation between the various monomers, present in whole or in part, to form polyamide chains, with formation of the elimination product, particularly water, a portion of which can vaporize. The modified polyamide of the invention is generally obtained by heating, at high temperature and high pressure, of for example an aqueous solution comprising the monomers, or a liquid comprising the monomers, to evaporate the elimination product, particularly the water (initially present in the polymerization medium and/or formed during the polycondensation) while avoiding any solid phase formation to prevent the mixture from setting solid.

The polycondensation reaction is generally performed at a pressure between 0.5 and 3.5 MPa, preferably between 0.5 and 2.5 MPa, and at a temperature between 100° C. and 320° C., preferably between 180° C. and 300° C. The polycondensation is generally conducted in molten phase at atmospheric pressure or reduced pressure so as to achieve the desired degree of progress.

The polycondensation product is a molten polymer or prepolymer. It may comprise a vapor phase consisting essentially of vapor of the elimination product, in particular water, which may have been formed and/or vaporized.

This product may be subjected to steps for separating out the vapor phase and for finishing in order to achieve the desired degree of polycondensation. The separation of the vapor phase may be performed, for example, in a cyclone-type device. Such devices are known.

The finishing consists in maintaining the polycondensation product in molten form, at a pressure in the region of atmospheric pressure or at a reduced pressure, for a time that is sufficient to achieve the desired degree of progress. Such an operation is known to those skilled in the art. The temperature of the finishing step is advantageously greater than or equal to 100° C. and in all cases greater than the solidification temperature of the polymer. The residence time in the finishing device is preferably greater than or equal to 5 minutes.

The polycondensation product may also undergo a post-condensation step in solid phase. This step is known to those skilled in the art and makes it possible to increase the degree of polycondensation to a desired value.

The process of the invention is similar in its conditions to the standard process for preparing polyamide of the type obtained from dicarboxylic acids and diamines, in particular the process for manufacturing polyamide 66 from adipic acid and hexamethylenediamine and polyphthalamides. This process for manufacturing polyamide 66 is known to those skilled in the art. The process for manufacturing polyamide of the type obtained from dicarboxylic acids and diamines generally uses, as starting material, a salt obtained by mixing, in stoichiometric amount, generally in a solvent such as water, a diacid with a diamine. Thus, in the manufacture of poly (hexamethylene adipamide), adipic acid is mixed with hexamethylenediamine, generally in water, to obtain hexamethylenediammonium adipate, which is more commonly known as Nylon salt or "N salt".

Thus, when the process of the invention uses a diacid and a diamine, these compounds can be added, at least in part, in the form of a salt. In particular when the diacid is adipic acid and the diamine is hexamethylenediamine, these compounds can be added at least in part in the form of N salt. This allows a stoichiometric balance to be obtained. Similarly, when the hydroxyaromatic compound is a diacid or a diamine, it is likewise possible to add it in salt form, with a diamine or a diacid.

The process of the invention generally leads to a random polymer when the hydroxyaromatic compound is polyfunctional, in particular at least difunctional, and to a partially or entirely hydroxyaromatic-terminated polyamide when the hydroxyaromatic compound is monofunctional.

The modified polyamide that is obtained at the end of the finishing step can be cooled and granulated.

The modified polyamide according to the invention can be used as a matrix, on its own or in combination with other thermoplastic polymers, in particular polyamides, polyesters or polyolefins.

The composition according to the invention comprises reinforcing or bulking fillers, such as, for example, fibrous fillers and/or nonfibrous fillers.

Mention may be made, as fibrous fillers, of glass fibers, carbon fibers, natural fibers, aramid fibers and nanotubes, in particular carbon nanotubes. Mention may be made, as natural fibers, of hemp and flax. Mention may in particular be made, among nonfibrous fillers, of all particulate or lamellar fillers and/or exfoliable or nonexfoliable nanofillers, such as alumina, carbon black, aluminosilicate clays, montmorillonites, zirconium phosphate, kaolin, calcium carbonate, diatomaceous earths, graphite, mica, silica, titanium dioxide, zeolites, talc, wollastonite, polymeric fillers, such as, for example, dimethacrylate particles, glass beads or glass powder.

It is perfectly possible according to the invention for the composition to comprise several types of reinforcing fillers. Preferably, the most widely used filler can be glass fibers, of the "chopped" type, in particular having a diameter of between 7 and 14 µm. These fillers can exhibit a surface sizing that provides for mechanical adhesion between the fibers and the polyamide matrix.

The concentration by weight of the reinforcing or bulking fillers is advantageously between 1% and 60% by weight, preferably between 15% and 50% by weight, with respect to the total weight of the composition.

The composition according to the invention can contain all types of flame retardants, in other words compounds reducing the spread of the flame and/or having fireproofing properties, which are well known to those skilled in the art. These flame retardants are conventionally used in fireproof compositions and are described in particular, for example, in the U.S. Pat. Nos. 6,344,158, 6,365,071, 6,211,402 and 6,255,371, mentioned here by way of reference.

The fireproofing system advantageously comprises at least one flame retardant selected from the group comprising:
flame retardants containing phosphorus, such as:
  phosphine oxides such as for example triphenylphosphine oxide, tri(3-hydroxypropyl)phosphine oxide and tri(3-hydroxy-2-methylpropyl)phosphine oxide;
  phosphonic acids or salts thereof or phosphinic acids or salts thereof, such as for example the zinc, magnesium, calcium, aluminum or manganese salts of phosphinic acids, in particular the aluminum salt of diethylphosphinic acid or the zinc salt of dimethylphosphinic acid;
  cyclic phosphonates, such as cyclic diphosphate esters, such as for example Antiblaze 1045;
  organic phosphates, such as triphenylphosphate;
  inorganic phosphates, such as ammonium polyphosphates and sodium polyphosphates;
  red phosphorus, whether for example in stabilized or coated form, in powder form or in the form of masterbatches;
flame retardants of the organic nitrogen-containing compound type, such as for example triazines, cyanuric and/or isocyanuric acid, melamine or derivatives thereof such as melamine cyanurate, melamine oxalate, phthalate, borate, sulfate, phosphate, polyphosphate and/or pyrophosphate, condensed melamine products such as melem, melam and melon, tris(hydroxyethyl) isocyanurate, benzoguanamine, guanidine, allantoin and glycoluril;
flame retardants containing halogenated derivatives, such as:
  bromine derivatives such as for example PBDPOs (polybromodiphenyl oxides), BrPS (brominated polystyrene and polybromostyrene), poly(pentabromobenzyl acrylate), brominated indane, tetradecabromodiphenoxybenzene (Saytex 120), 1,2-bis(pentabromophenyl) ethane or Saytex 8010 from Albemarle, tetrabromobisphenol A and brominated epoxy oligomers. Among the brominated derivatives, mention may be made in particular of polydibromostyrene such as PDBS-80 from Chemtura, brominated polystyrenes such as Saytex HP 3010 from Albemarle or FR-803P from Dead Sea Bromine Group, decabromodiphenyl ether (DBPE) or FR-1210 from Dead Sea Bromine Group, octabromodiphenyl ether (OBPE), 2,4,6-tris(2, 4,6-tribromophenoxy)-1,3,5 triazine or FR-245 from Dead Sea Bromine Group, poly(pentabromobenzyl acrylate) or FR-1025 from Dead Sea Bromine Group and the epoxy-terminated oligomers or polymers of tetrabromobisphenol A such as F-2300 and F2400 from Dead Sea Bromine Group;
  chlorinated compounds, such as for example a chlorinated cycloaliphatic compound such as Dechlorane Plus® (sold by OxyChem, see CAS 13560-89-9).

These compounds can be used on their own or in combination, sometimes synergistically. A synergistic association of compounds containing phosphorus, such as phosphine oxides, phosphonic acids or salts thereof or phosphinic acids or salts thereof, and cyclic phosphonates, with nitrogen-containing derivatives such as melam, melem, melamine phosphate, melamine polyphosphates, melamine pyrophosphates or ammonium polyphosphates, is preferred in particular. Antimony compounds, metal oxides and zinc borate can be used in particular as synergist agents.

The composition can comprise from 5% to 40% by weight of flame retardants, with respect to the total weight of the composition.

The composition according to the invention can additionally comprise fillers and/or additives conventionally used in the manufacture of polyamide compositions. Thus, mention may be made of lubricants, plasticizers, nucleating agents, impact modifiers, catalysts, light and/or heat stabilizers, antioxidants, antistatic agents, colorants, mattifying agents, molding aids or other conventional additives.

It is possible in particular to add to the polyamide composition, agents that modify the impact strength. It is generally elastomeric polymers that can be used to this end. The agents that modify the toughness are generally defined as having an ASTM D-638 tensile modulus of less than approximately 500 MPa. Examples of suitable elastomers are ethylene/acrylic ester/maleic anhydride products, ethylene/propylene/maleic anhydride products or ethylene/propylene/diene monomer products (EPDMs) with optionally a grafted maleic anhydride. The concentration of elastomer by weight is advantageously between 0.1% and 30%, with respect to the total weight of the composition.

Preference is given in particular to impact modifiers comprising functional groups that react with the polyamide. Mention may be made, for example, of terpolymers of ethylene, acrylic ester and glycidyl methacrylate, copolymers of ethylene and butyl ester acrylate, copolymers of ethylene, n-butyl acrylate and glycidyl methacrylate, copolymers of ethylene and maleic anhydride, styrene/maleimide copolymers grafted with maleic anhydride, styrene/ethylene/butylene/styrene copolymers modified with maleic anhydride, styrene/acrylonitrile copolymers grafted with maleic anhydrides, acrylonitrile/butadiene/styrene copolymers grafted with maleic anhydrides, and their hydrogenated versions. The proportion by weight of these modifiers in the total composition is in particular between 0.1% and 40%.

These fillers and additives can be added to the modified polyamide by conventional means suited to each filler or additive, such as, for example, during polymerization or in melt blending.

The materials and compositions of the invention are generally obtained by blending the various constituents under hot conditions, for example in a single- or twin-screw extruder, at a temperature sufficient to keep the polyamide resin as a molten medium, or under cold conditions, in a mechanical mixer in particular. Generally, the blend obtained is extruded in the form of rods, which are cut up into pieces to form granules. The compounds can be added at any point in the process for the manufacture of the plastic, in particular by hot or cold blending with the plastic matrix. The addition of the compounds and additives can be carried out by addition of these compounds to the molten plastic matrix in the pure form or in the form of a concentrated mixture in a matrix, such as, for example, a plastic matrix.

The composition is preferably a composition to be molded, for example in the form of granules or powder, used in particular in the manufacture of articles by an injection molding process. The composition according to the invention can be used in any process for forming plastics, such as, for example, molding processes, in particular injection molding, rotational molding, sintering or casting, or extrusion processes, such as extrusion blow molding and film-forming. The invention thus also relates to processes for the manufacture of molded or extruded articles by forming a composition of the invention.

The present invention relates in particular also to articles of the surface-mounted component (SMC) type obtained by forming the composition according to the invention. These articles are generally produced by an injection molding process in which a composition according to the invention, in particular in the form of granules, is introduced into an injection-molding device and the molding is carried out.

The present invention likewise relates to a process for assembling surface-mounted components (SMCs) such as described above by means of a soldering and/or brazing technique, such as in particular vapor-phase soldering, wave soldering, dip soldering, infrared reflow soldering, or conventional hot-air soldering. The present invention also relates to a process for assembling surface-mounted components (SMCs) such as described above on a support such as a printed circuit board by reflow soldering using a lead-free solder cream or paste.

As types of surface-mounted components mention may be made in particular of electrical connectors, such as I/O (input/output) connectors, FCP (flat printed circuit) connectors, PCB (printed circuit board) connectors, FFC (flat flexible cable) connectors and MID (molded integrated device) connectors. In particular the surfaces can be a printed circuit or an electronic board, for example, generally comprising a "component" surface and a "soldering" surface.

An electrical connector comprises one or more electrically conductive elements encased by a housing made from an electrically insulating material such as a plastic. This plastic can be a polymer composition and the housing can be obtained by injection molding.

Specific language is used in the description so as to facilitate understanding of the principle of the invention. Nevertheless, it should be understood that no limitation of the scope of the invention is envisaged by the use of this specific language. Modifications and improvements may in particular be envisaged by a person conversant with the technical field concerned on the basis of his own general knowledge.

The term "and/or" includes the meanings "and", "or" and all the other possible combinations of the elements connected to this term.

Other details or advantages of the invention will become more clearly apparent in the light of the examples given below purely by way of indication.

EXPERIMENTAL SECTION

Characterizations

Terminal acid group (TCG) and terminal amine group (TAG) contents: assayed by potentiometry, expressed in meq/kg. Chain blocking group (TBG) content calculated from the initial reactant quantities. For example, benzoic acid or acetic acid can be used as chain blockers.

Number-average molecular weight Mn determined by the formula $Mn=2.10^6/(TAG+TCG+TBG)$ and expressed in g/mol.

Melting point ($T_m$) and associated enthalpy ($\Delta Hm$), and crystallization temperature on cooling ($T_c$): determined by differential scanning calorimetry (DSC), using a Perkin Elmer Pyris 1 device, at a rate of 10° C./min.

Glass transition temperature ($T_g$) determined on the same device at a rate of 40° C./min.

Polymers Used:

Preparation of an Unmodified PA 66

To a polymerization reactor are added 92.6 kg (353 mol) of N salt (1:1 salt of hexamethylenediamine and adipic acid), 84 kg of demineralized water and 6.4 g of Silcolapse 5020® antifoaming agent. The polyamide 66 is made according to a standard polyamide 66 polymerization process, with 30 minutes finishing. The polymer obtained is cast in rod form, cooled, and formed into granules by cutting the rods.

The polymer obtained presents the following characteristics: TCG=70.2 meq/kg, TAG=51.5 meq/kg, Mn=16 430 g/mol. The polyamide 66 is semicrystalline and has the following thermal characteristics: $T_g$=70.6° C., $T_c$=230.9° C., $T_m$=263.7° C., ΔHm=68.4 J/g.

Preparation of a Copolyamide PA 66/6HIA 95/5 Molar or 94.2/5.8 by Weight

To a polymerization reactor are added 87.3 kg (332.8 mol) of N salt (1:1 salt of hexamethylenediamine and adipic acid), 3219 g of 99.5% 5-hydroxyisophthalic acid (HIA) (17.5 mol), 6276 g of a 32.4% by weight solution of hexamethylenediamine (HMD) in solution in water (17.5 mol) and 81.2 kg of demineralized water and 6.4 g of Silcolapse 5020® antifoaming agent. The copolyamide is made according to a standard polyamide 66 polymerization process, with 35 minutes finishing. The polymer obtained is cast in rod form, cooled, and formed into granules by cutting the rods.

The polymer obtained presents the following characteristics: TCG=78.4 meq/kg, TAG=57.6 meq/kg, Mn=14 700 g/mol. The copolyamide is semicrystalline and has the following thermal characteristics: $T_g$=76.8° C., $T_c$=218.4° C., $T_m$=256.2° C., ΔHm=62.5 J/g. The Tg of the copolyamide is 6.2° C. higher than that of the PA 66.

Preparation of a Copolyamide PA 66/6HIA 85/15 Molar or 83/17 by Weight

To a polymerization reactor are added 76.9 kg (293.1 mol) of N salt (1:1 salt of hexamethylenediamine and adipic acid), 9462 g of 99.5% 5-hydroxyisophthalic acid (HIA) (51.7 mol), 18 624 g of a 32.25% by weight solution of hexamethylenediamine (HMD) in solution in water (51.7 mol) and 72.6 kg of demineralized water and 6.4 g of Silcolapse 5020® antifoaming agent. The copolyamide is made according to a standard polyamide 66 polymerization process, with 35 minutes finishing. The polymer obtained is cast in rod form, cooled, and formed into granules by cutting the rods.

The polymer obtained presents the following characteristics: TCG=82.7 meq/kg, TAG=61.5 meq/kg, Mn=13 870 g/mol. The copolyamide is semicrystalline and has the following thermal characteristics: $T_g$=85.8° C., $T_c$=186.2° C., $T_m$=240.4° C., ΔHm=41.9 J/g. The Tg of the copolyamide is 15.2° C. higher than that of the PA 66.

Preparation of a Polyamide PA 6HIA

A 51% by weight 6HIA salt in water is produced by blending a stoichiometric amount of hexamethylenediamine and 5-hydroxyisophthalic acid in water. To a polymerization reactor are then added 5623 g of 51% 6HIA salt, 112.1 g of 99.5% 5-hydroxyisophthalic acid, 105 g of water and 3.3 g of antifoaming agent. The polyamide PA 6HIA is made according to a standard polyamide 66 polymerization process, with 30 minutes finishing. The polymer obtained is cast in rod form, cooled, and formed into granules by cutting the rods.

The polymer obtained is amorphous and has a glass transition temperature $T_g$=166.6° C.

Preparation of PA 66+PA 6HIA 94.2/5.8 and PA 66+PA 6HIA 83/17 by Weight Blends

Before being blended, the PA 66 and PA 6HIA are dried so as to obtain a water content of less than 1000 ppm in the granules. The PA 66 and PA 6HIA prepared in this way are melt blended in a proportion of 94.2/5.8 and 83/17 by weight in a WERNER & PFLEIDERER ZSK40 W325 co-rotating twin-screw extruder operating at a throughput of 40 kg/h at a screw speed of 270 rpm and at a pressure reduced to 0.9 bar. The temperature settings in the 8 zones are respectively: 245, 255, 255, 255, 255, 260, 260, 270° C. All the components in the formulation are added at the start of the extruder.

Preparation of a Polyamide PA 66/6T/6HIA 49/41/10 Molar

To a polymerization reactor are added 43.12 kg of N salt (164.36 mol), 38.82 kg of a 6T salt (1:1 salt of hexamethylenediamine and terephthalic acid) (137.50 mol), 6.14 kg of 99.5% 5-hydroxyisophthalic acid (HIA) (33.5 mol), 13 kg of a 32.50% by weight solution of hexamethylenediamine (HMD) in solution in water (36.36 mol), 699.5 g of 99% benzoic acid (5.67 mol) and 77.1 kg of demineralized water and 6.4 g of Silcolapse 5020 antifoaming agent. The copolyamide is made according to a standard polyamide 66 polymerization process, at a final temperature of 290° C. and with 15 minutes finishing. The polymer obtained is cast in rod form, cooled, and formed into granules by cutting the rods.

The polymer obtained presents the following characteristics: TCG=86.7 meq/kg, TAG=45.7 meq/kg, TBG=71 meq/kg, Mn=9830 g/mol. The polyamide PA 66/6T/6HIA 49/41/10 is semicrystalline and has the following thermal characteristics: $T_g$=103.8° C., $T_c$=253.4° C., $T_m$=279.7° C., ΔHm=45.7 J/g. This polymer having a high melting point is used to prepare a formulation intended for manufacturing connectors.

Preparation of Formulations Comprising Glass Fibers

Polyamide formulations containing 30% by weight of glass fibers are produced by melt blending in a WERNER & PFLEIDERER ZSK40 W325 co-rotating twin-screw extruder operating at a throughput of 40 kg/h at a screw speed of 270 rpm and at a pressure reduced to 0.9 bar. The temperature settings in the 8 zones are respectively: 245, 255, 255, 255, 255, 260, 260, 270° C. All the components in the formulation are added at the start of the extruder. For certain tests novolac resin was also added to the extruder.

EXAMPLE 1

Injection Molding and Dimensional Stability Test in a Damp Environment

The polyamides and the GF30 formulations are dried to a water content of less than 1000 ppm before being coated in ethylene bis(stearamide) (EBS) added at a proportion of 0.25% by weight. The externally lubricated polyamides and GF30 formulations are then injection molded in the form of sheets measuring 100×100×2 mm³ in a DEMAG 80t injection molding press with the following parameters: mold temperature set to 80° C., cylinder temperatures 275/280/285/290° C. for the PA 66 GF30 and 265/275/275/280° C. for the copolyamide PA 66/6HIA 85/15 GF30 and PA 66+PA 6HIA 83/17 GF30 blend, cycle time 25 s.

The sheets are placed in a climatic chamber adjusted to a temperature of 70° C. and a relative humidity of 62% until saturation water uptake is reached (after 264 h). Dimensional variation in a damp environment was measured in the directions parallel (∥) and perpendicular (⊥) to the injection direction on these same sheets before and after conditioning for 264 h at RH62 70° C.

The results for dimensional variation in a damp environment are set out in the table below. By way of example we have given the values for dimensional variation of PA 66+novolac resin blends in which the content of phenol units with respect to amide units is similar to that of a copolyamide PA 66/6HIA 85/15 mol/mol or a PA 66+PA 6HIA 83/17 weight/weight blend.

TABLE 1

| Formulation | Type | Dimensional variation (∥) | Dimensional variation (⊥) |
|---|---|---|---|
| C1 | PA 66 | 0.33 | 0.36 |
| C2 | PA 66/6HIA 95/5 mol | 0.23 | 0.23 |
| C3 | PA 66/6HIA 85/15 mol | 0.51 | 0.51 |

TABLE 1-continued

| Formulation | Type | Dimensional variation (∥) | Dimensional variation (⊥) |
|---|---|---|---|
| C4 | PA 66/PA 6HIA 94.2/5.8 by weight | 0.10 | 0.13 |
| C5 | PA 66/PA 6HIA 83/17 by weight | 0.10 | 0.30 |
| C6 | PA 66 + 7% by weight novolac | 0.14 | 0.13 |
| C7 | PA 66 GF30 | 0.15 | 0.30 |
| C8 | PA 66 + 7% by weight novolac GF30 | 0.15 | 0.22 |
| 1 | PA 66/6HIA 85/15 mol GF30 | 0.06 | 0.05 |
| 2 | PA 66/PA 6HIA 83/17 by weight GF30 | 0.15 | 0.12 |

Surprisingly, we observed that the dimensional stability of the copolyamide PA 66/6HIA 85/15 is lower than that of PA 66 but that on formulations containing 30% of glass fibers, the PA 66/6HIA 85/15 GF30 has the best dimensional stability, indicating a strong adhesion of the polyamide bearing hydroxyaromatic functions to the glass fibers.

EXAMPLE 2

Preparation of a Fireproof Formulation from the Polyamide PA 66/6T/6HIA 49/41/10

Before being formulated, the PA 66/6T/6HIA 49/41/10 is dried at 90° C. under vacuum in a weak nitrogen flow so as to obtain a water content of less than 1000 ppm. It is then melt blended in a co-rotating twin-screw extruder (internal diameter 30 mm and L/D=30) with type 301×1 glass fibers from CPIC (30% by weight), a diethylphosphinic acid aluminum salt flame retardant, Exolit OP1230, from Clariant (18% by weight), and a blend of heat stabilizer and lubricant (0.5% by weight). The extruder cylinder temperatures are set to between 270° C. and 290° C., the screw speed is 250 rpm under a vacuum of 50-70 cmHg, the throughput is 25 to 30 kg/h under these conditions.

This formulation is injection molded in an ENGEL 80t injection molding press with a cylinder temperature set to 290° C. in a mold whose temperature is kept at around 90° C. The UL 94 test performed on UL-type specimens of thickness 0.8 mm indicates a rating of V0. The mechanical properties indicate a tensile stress at break of 152 MPa and an elongation at break of 2.1%. The flexural stress is 247 MPa and the flexural modulus is 10 550 MPa. The impact strength is assessed by means of an unnotched Charpy test: 67 kJ/m².

This formulation is subjected to a blistering resistance test by introducing a previously injection-molded 0.8 mm UL-type specimen (dimensions 127×12.7×0.8 mm³) into a Seho FDS Maxipower machine according to a standard reflow soldering process with a peak temperature of 247° C. (step one: heat from 30° C. to 120° C. at 2.8° C./s; step two: heat from 120° C. to 190° C. at 0.5° C./s; step three: heat from 190° C. to 247° C. at 0.85° C./s; step four: isothermal at 247° C. for 5 s; step five: rapid cooling at −3° C./s to ambient temperature). It exhibits no signs of blistering.

By way of comparison a formulation of a PA 66/6T 65/35 molar (with a melting point identical to that of the PA 66/6T/6HIA 49/41/10) GF30 containing 18% by weight of a diethylphosphinic acid aluminum salt flame retardant, Exolit OP1230, from Clariant, 0.5% by weight of a blend of heat stabilizer and lubricant and 4% by weight of a Durez novolac resin from Sumitomo Bakelite Co., Ltd. Group was examined. The 0.8 mm UL test indicates a rating of V0, but the blistering resistance test with a peak temperature of 247° C. shows the presence of blistering, i.e. blisters or bubbles formed on the surface in contact with the hot air, distributed homogeneously across the entire surface area in contact with the heat source and with a diameter of between 1 mm and 10 mm.

The invention claimed is:

1. A component for surface mounting obtained at least from a composition comprising at least a semiaromatic polyamide modified by an aromatic hydroxyl compound, a fibrous filler; and a flame retardant
wherein the aromatic hydroxyl compound is represented by the following formula (I):

$$(HO)_x\text{—}Z\text{—}(F)_n \quad (I)$$

and wherein:
Z is a multivalent aromatic or arylaliphatic hydrocarbon radical;
x is from 1 to 10;
F is an acid, aldehyde, amine or ketone function that can bond to an acid or amine function of the polyamide monomers; and
n is from 1 and 5.

2. The component as defined in claim 1, wherein 5 mol % to 50 mol % of the monomers used in the semiaromatic polyamide are monomers comprising aromatic groups, including the aromatic hydroxyl compound.

3. The component as defined in claim 1, wherein the polyamide is selected from the group consisting of: polyamide 6T, polyamide 66/6T, polyamide 6I, polyamide 66/6I, polyamide 6T/6I, copolyamide 6/6T of differing molar compositions and blends thereof.

4. The component as defined in claim 1, wherein the polyamide has a melting point of from 150° C. to 340°C.

5. The component as defined in claim 1 the composition comprises 30% to 75% by weight of polyamide, with respect to the total weight of the composition.

6. The component as defined in claim 1, wherein the aromatic hydroxyl compound has at least one function that can react with the functions of the polyamide or the polyamide monomers.

7. The component as defined in claim 1, wherein Z is a multivalent radical selected from the group consisting of: benzene, methylbenzene, a naphthalene, a biphenyl, a diphenyl ether, a diphenyl sulfide, a diphenyl sulfone, a ditolyl ether, a xylylene, a diethylbenzene and a pyridine.

8. The component as defined in claim 1, wherein the aromatic hydroxyl compound is selected from the group consisting of: a 2-hydroxyterephthalic acid, a 5-hydroxyisophthalic acid, a 4-hydroxyisophthalic acid, a 2,5-dihydroxyterephthalic acid, a 4-hydroxyphenylacetic acid or a gallic acid, a L-tyrosine, a 4-hydroxyphenylacetic acid, a 3,5-diaminophenol, a 5-hydroxy-m-xylylenediamine, a 3-aminophenol, a 3-amino-4-methylphenol and a 3-hydroxy-5-aminobenzoic acid.

9. The component as defined in claim 1, wherein the fibrous filler is selected from the group consisting of glass fiber, a carbon fiber, a natural fiber, an aramid fiber, nanotube, hemp and flax.

10. The component as defined in claim 1, wherein the composition comprises 15% to 50% by weight of reinforcing filler, with respect to the total weight of the composition.

11. The component as defined in claim 1, wherein the flame retardant is comprised of phosphorus and is selected from the group consisting of: a phosphine oxide, a phosphonic acid or a salt thereof, a phosphinic acid or a salt thereof, a cyclic phosphonate, an organic phosphate, an inorganic phosphate, and a red phosphorus.

12. The component as defined in claim 1, wherein the flame retardant is an organic nitrogen flame retardant selected from the group consisting of: a triazine, a cyanuric acid, an isocyanuric acid, a melamine, a melamine oxalate, a phthalate, a borate, a sulfate, a phosphate, a polyphosphate, a pyrophosphate, a condensed melamine product, a tris(hydroxyethyl) isocyanurate, a benzoguanamine, a guanidine, a allantoin, and a glycoluril.

13. The component as defined in claim 1, wherein the flame retardant is a flame retardant comprising a brominated derivative selected from the group consisting of: a PBDPO (a polybromodiphenyl oxide), a BrPS (a brominated polystyrene and polybromostyrene), poly(pentabromobenzyl acrylate), brominated indane, tetradecabromodiphenoxybenzene, 1,2-bis (pentabromophenyl)ethane, tetrabromobisphenol A and a brominated epoxy oligomer.

14. The component as defined in claim 1, wherein the composition comprises 5% to 40% by weight of flame retardants, with respect to the total weight of the composition.

15. A process for assembling a component as defined in claim 1 on a surface, the process comprising soldering and/or brazing.

\* \* \* \* \*